(12) United States Patent
Lee et al.

(10) Patent No.: US 10,181,413 B2
(45) Date of Patent: Jan. 15, 2019

(54) LASER CRYSTALLIZATION APPARATUS FOR CRYSTALLIZING AN AMORPHOUS SILICON THIN FILM

(71) Applicant: SAMSUNG DISPLAY CO., LTD., Yongin-si, Gyeonggi-Do (KR)

(72) Inventors: Chung Hwan Lee, Seoul (KR); Hong Ro Lee, Seongnam-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/138,986

(22) Filed: Apr. 26, 2016

(65) Prior Publication Data

US 2017/0098562 A1 Apr. 6, 2017

(30) Foreign Application Priority Data

Oct. 1, 2015 (KR) .................. 10-2015-0138733

(51) Int. Cl.
| | | |
|---|---|---|
| H01L 21/67 | (2006.01) | |
| H01L 21/02 | (2006.01) | |
| H01S 3/00 | (2006.01) | |
| B23K 26/06 | (2014.01) | |
| B23K 26/12 | (2014.01) | |

(52) U.S. Cl.
CPC .... H01L 21/67115 (2013.01); B23K 26/0648 (2013.01); B23K 26/127 (2013.01); H01L 21/02678 (2013.01); H01S 3/0085 (2013.01); H01L 21/02532 (2013.01); H01L 21/02686 (2013.01)

(58) Field of Classification Search
USPC ........................................ 250/492.2
See application file for complete search history.

(56) References Cited

U.S. PATENT DOCUMENTS

| | | | | |
|---|---|---|---|---|
| 5,117,255 A | * | 5/1992 | Shiraishi ............ | G03F 7/70241 355/52 |
| 5,721,416 A | * | 2/1998 | Burghardt .......... | B23K 26/0738 219/121.73 |
| 6,522,390 B2 | * | 2/2003 | Suzuki ................ | G03F 7/701 355/53 |

(Continued)

FOREIGN PATENT DOCUMENTS

| | | |
|---|---|---|
| KR | 1020080039449 | 5/2008 |
| KR | 1020140130351 | 11/2014 |

(Continued)

Primary Examiner — Phillip A Johnston
(74) Attorney, Agent, or Firm — F. Chau & Associates, LLC

(57) ABSTRACT

A laser crystallization apparatus includes a laser generator that generates a laser beam including a plurality of line beams that are parallel to each other. An optical system includes a plurality of lenses and mirrors, wherein the optical system optically converts the generated laser beam to a converted laser beam. A chamber includes a stage and a substrate disposed on the stage, wherein a laser-crystallized thin film is formed on the substrate when the substrate is irradiated by the converted laser beam. A line focus adjuster that adjusts a line focus and a final focus of the plurality of line beams passing through the optical system, wherein the substrate is irradiated by the plurality of line beams at the final focus of the plurality of line beams.

20 Claims, 10 Drawing Sheets

(56) References Cited

U.S. PATENT DOCUMENTS

| | | | | |
|---|---|---|---|---|
| 6,730,550 B1 * | 5/2004 | Yamazaki | ........... | H01L 21/2026 |
| | | | | 257/E21.134 |
| 8,115,137 B2 * | 2/2012 | Kawaguchi | .......... | B23K 26/046 |
| | | | | 219/121.73 |

FOREIGN PATENT DOCUMENTS

| KR | 1020150038971 | 4/2015 |
|---|---|---|
| KR | 1020150064067 | 6/2015 |

* cited by examiner

LASER CRYSTALLIZATION APPARATUS FOR CRYSTALLIZING AN AMORPHOUS SILICON THIN FILM

CROSS REFERENCE TO RELATED APPLICATION(S)

This application claims priority under 35 U.S.C. § 119 to Korean Patent Application No. 10-2015-0138733, filed in the Korean Intellectual Property Office on Oct. 1, 2015, the disclosure of which is incorporated by reference herein in its entirety.

TECHNICAL FIELD

Exemplary embodiments of the present invention relate to a laser crystallization apparatus, and more particularly, to a laser crystallization apparatus that crystallizes an amorphous silicon thin film to a polycrystalline silicon thin film by using an excimer laser.

DISCUSSION OF THE RELATED ART

A laser crystallization apparatus includes a laser generator that generates an energy source, a plurality of lens and mirrors, an optical system that forms a laser beam to a desired size, and a chamber where a substrate is crystallized by the beam from the optical system.

A laser beam is formed in a line beam form having a major axis and a minor axis, and a P-lens module that decrease the size of the minor axis.

The P-lens module has a structure that moves vertically. Vertical adjustment of the P-lens module is performed by manually adjusting a screw. In order to find an optimal line focus of the P-lens module, after stopping operation of a corresponding apparatus, the substrate is irradiated by the laser beam while manually changing a vertical axis of the P-lens module in various conditions.

Then, the substrate is checked with a microscope, and a point of a z-axis that best fits the final focus is set.

However, in such a case, productivity may decrease due to a long stop of the laser crystallization apparatus, and continuous monitoring of the laser crystallization apparatus may be difficult.

In addition, when the optimal line focus by the P-lens module is deviated, the substrate is irradiated by a laser beam having a decreased energy. Accordingly, product defects may occur.

SUMMARY

According to an exemplary embodiment of the present invention, a laser crystallization apparatus includes a laser generator that generates a laser beam including a plurality of line beams that are parallel to each other. An optical system includes a plurality of lenses and mirrors, wherein the optical system optically converts the generated laser beam to a converted laser beam. A chamber includes a stage and a substrate disposed on the stage, wherein a laser-crystallized thin film is formed on the substrate when the substrate is irradiated by the converted laser beam. A line focus adjuster adjusts a line focus and a final focus of the plurality of line beams passing through the optical system, wherein the substrate is irradiated by the plurality of line beams at the final focus of the plurality of line beams.

In an exemplary embodiment of the present invention, the line focus adjuster includes a P-lens that is a last lens from among the plurality of lenses and mirrors of the optical system which the plurality of line beams pass through, one or more P-lens drivers that move a position of the P-lens, a first monitoring chamber that monitors the line focus of the plurality of line beams passing through the P-lens, and a controller that inputs information of the monitored plurality of line beams and transmits a control signal to the one or more P-lens drivers so that the P-lens is driven.

In an exemplary embodiment of the present invention, the P-lens driver includes a piezo motor or a stepping motor.

In an exemplary embodiment of the present invention, the one or more P-lens drivers are disposed at opposite sides of the P-lens to operate the P-lens in a direction perpendicular to a planar surface of the substrate.

In an exemplary embodiment of the present invention, the one or more P-lens drivers simultaneously move the opposite sides of the P-lens.

In an exemplary embodiment of the present invention, the one or more P-lens drivers separately move each of the opposite sides of the P-lens.

In an exemplary embodiment of the present invention, a first monitoring member is disposed on a beam cutter that is provided at opposite sides of a window of the chamber.

In an exemplary embodiment of the present invention, the first monitoring member monitors a portion of a major axis of the laser beam cut by the beam cutter.

In an exemplary embodiment of the present invention, the laser crystallization apparatus further includes a second monitoring member disposed on the stage, wherein the second monitoring member monitors a width of a minor axis of the laser beam.

In an exemplary embodiment of the present invention, the second monitoring member is configured to move in a direction perpendicular to a planar direction of the stage.

In an exemplary embodiment of the present invention, the second monitoring member is disposed in a central area of the stage.

In an exemplary embodiment of the present invention, the second monitoring member is configured to move in a direction parallel to the minor axis of the laser beam.

In an exemplary embodiment of the present invention, the second monitoring member is configured to move in a direction parallel to the major axis of the laser beam.

In an exemplary embodiment of the present invention, a plurality of the second monitoring members are formed on a surface of the stage.

According to an exemplary embodiment of the present invention, a laser crystallization apparatus includes a laser beam generator that generates a plurality of parallel line beams. An optical system includes a mirror and a lens, wherein the plurality of parallel line beams enter the optical system, are reflected by the mirror, and pass through the lens. A chamber includes a stage and a substrate disposed on the stage. A thin film disposed on the substrate is irradiated by the plurality of parallel line beams that have passed through the lens.

In an exemplary embodiment of the present invention, the lens is a P-lens.

In an exemplary embodiment of the present invention, the plurality of parallel line beams, having passed through the P-lens, are focused on substantially a same area of the substrate.

In an exemplary embodiment of the present invention, the laser crystallization apparatus further includes a first monitoring chamber configured to monitor a line focus of the plurality of parallel line beams passing through the P-lens. A P-lens driver is configured to move the P-lens in a direction substantially perpendicularly to a surface of the substrate on which the thin film is disposed based on a control signal. A controller is configured to transmit the control signal to the P-lens driver based on the monitored line focus of the plurality of parallel line beams.

In an exemplary embodiment of the present invention, the laser crystallization apparatus further includes a second monitoring member disposed on the stage, wherein the second monitoring member monitors a width of a minor axis of the plurality of parallel line beams. A P-lens driver is configured to move the P-lens in a direction substantially perpendicularly to a surface of the substrate on which the thin film is disposed based on a control signal. A controller is configured to transmit the control signal to the P-lens driver based on the monitored width of the minor axis of the plurality of parallel line beams.

In an exemplary embodiment of the present invention, the second monitoring member is configured to move along a plane that is parallel to the surface of the substrate on which the thin film is disposed.

BRIEF DESCRIPTION OF THE DRAWINGS

The above and other features and aspects of the present invention will become more apparent by describing in detail exemplary embodiments of the present invention with reference to the accompanying drawings, in which.

DETAILED DESCRIPTION OF THE EMBODIMENTS

Figure 1:
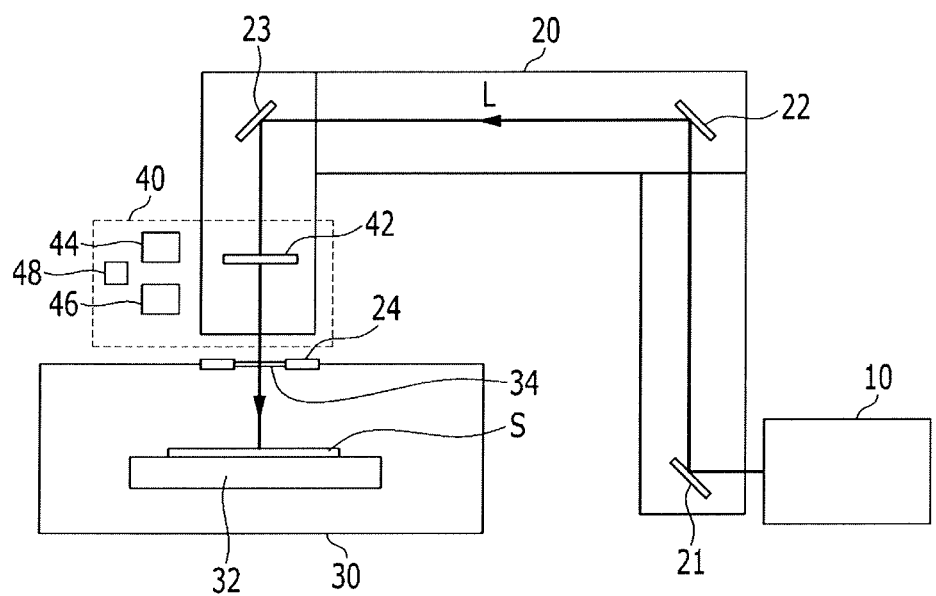
FIG. 1 is a diagram illustrating a laser crystallization apparatus according to an exemplary embodiment of the present invention.

The present invention will be described more fully hereinafter with reference to the accompanying drawings, in which exemplary embodiments thereof are shown. The disclosed exemplary embodiments of the present invention may be modified in various different ways without departing from the spirit and scope of the present invention.

Like reference numerals may refer to like elements throughout the specification. A repetitive description of elements already described may be omitted for brevity.

The drawings are schematic and the elements shown in the drawings might not be to scale.

The relative sizes and ratios of the parts or elements in the drawings may be exaggerated or reduced for clarity and convenience of illustration. The sizes of the parts or elements shown in the drawings are exemplary.

When a part is referred to as being "on" another part, it may be directly on the other part or intervening parts may also be present.

Accordingly, the exemplary embodiments of the present invention are not limited to the forms or shapes of the regions illustrated in the drawings, but may include forms or shapes that are modified during, for example, manufacturing.

A laser crystallization apparatus according to an exemplary embodiment of the present invention will now be described with reference to FIGS. 1 to 4.

Figure 2:
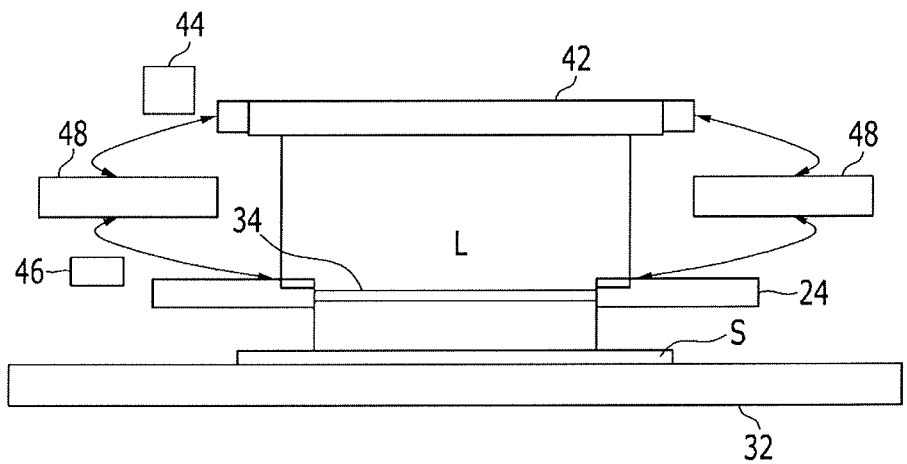
FIG. 2 is a diagram illustrating a line focus adjuster according to an exemplary embodiment of the present invention.
Figure 3:
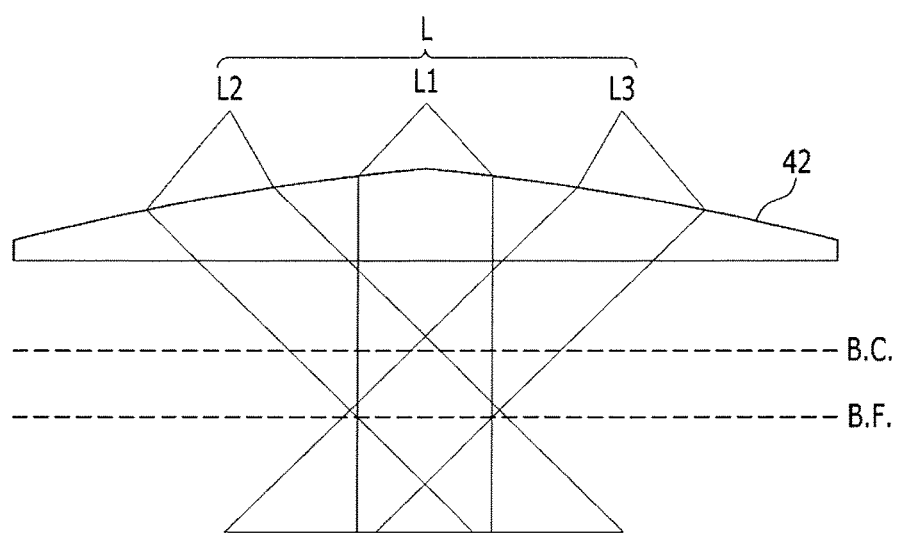
FIG. 3 is a figure illustrating a forming of a line focus of a laser beam by a P-lens according to an exemplary embodiment of the present invention.
Figure 4:
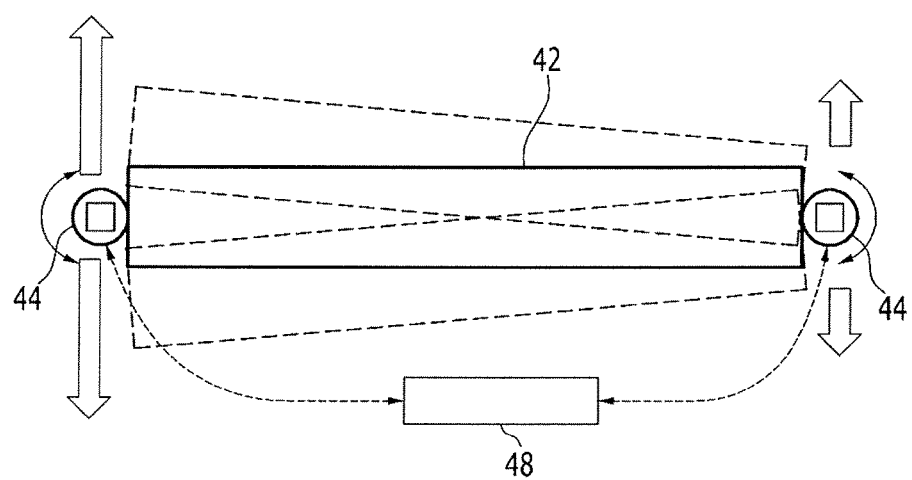
FIG. 4 is a diagram illustrating a P-lens driven by one or more P-lens drivers according to an exemplary embodiment of the present invention.

FIG. 1 is a diagram illustrating a laser crystallization apparatus according to an exemplary embodiment of the present invention. FIG. 2 is a diagram illustrating a line focus adjuster according to an exemplary embodiment of the present invention. FIG. 3 is a figure illustrating a forming of a line focus of a laser beam by a P-lens according to an exemplary embodiment of the present invention. FIG. 4 is a diagram illustrating a P-lens driven by one or more P-lens drivers according to an exemplary embodiment of the present invention.

Referring to FIG. 1, a laser crystallization apparatus according to an exemplary embodiment of the present invention includes a laser beam generator 10 that generates a laser beam L. An optical system 20 forms a converted laser beam L by optically converting the laser beam L. Chamber 30 includes a stage 32 on which a substrate S is mounted. A line focus adjuster 40 adjusts a line focus of the converted laser beam L passing through the optical system 20. A thin film disposed on a substrate S that is mounted on the stage 32 is irradiated by the converted laser beam L. A laser-crystallized thin film is formed on an upper surface the substrate S that is mounted on the stage 32 when the thin film is irradiated by the converted laser beam L.

The laser beam L generated by the laser beam generator 10 may include P polarization and S polarization. The laser beam L may be an excimer laser beam. The laser beam L is optically converted by the optical system 20. The converted laser beam L induces a phase transition of the thin film formed on the upper surface of the substrate S, and then crystallizes the thin film.

The thin film that is disposed on the substrate S may include an amorphous silicon layer, and may be formed by low pressure chemical vapor deposition, atmospheric pressure chemical vapor deposition, plasma enhanced chemical vapor deposition (PECVD), sputtering, vacuum evaporation, and the like.

In addition, the laser beam L may include a plurality of parallel line beams.

The optical system 20 includes a plurality of lenses and mirrors 21, 22, and 23 that change a path of the laser beam L and optically convert the laser beam L.

The optical system 20 may include at least one half wavelength plate (HWP) that changes a direction of a polarization axis of the laser beam L emitted from the laser beam generator 10, and at least one mirror that reflects all or close to all of the laser beam L.

The optical system 20 may include at least one polarization beam splitter (PBS) that partially reflects the laser beam L and partially transmits the laser beam L (e.g., transmits the portion of the laser beam L that is not reflected).

The plurality of lenses of the optical system 20, may include a P-lens 42 that reduces the size of the minor axis beam of the laser beam L.

In the chamber 30, an atmosphere including gas such as nitrogen ($N_2$), air, and mixed gas may vary depending on a characteristic of a process, a use of a user, and the like. The chamber 30 may have various gas pressure levels. The chamber 30, for example, may be under-pressurized or over-pressurized with reference to a threshold air pressure, or the chamber 30 may be in a vacuum state.

Therefore, the chamber 30 is not an open type but a closed type to be isolated from ambient air and/or pressure.

The chamber 30 includes a substrate stage 32 on which a substrate S is disposed. The thin film is disposed on the substrate S. The thin film is irradiated by the optically converted laser beam L and is crystallized by the optically converted laser beam L. The line focus adjuster 40 adjusts the line focus of the optically converted laser beam L, and then adjusts a final focus of the laser beam L. The substrate S is irradiated by the laser beam L that passed through the line focus adjuster 40.

The line focus adjuster 40 includes the P-lens 42, one or more P-lens drivers 44, a first monitoring member 46, and a controller 48.

The P-lens 42, which is a lens positioned closest to the chamber 30 among a plurality of lenses of the optical system 20, may be formed of a lens module having a plurality of lenses.

The P-lens 42 may include a structure that moves vertically as a whole. Through the vertical movement, the line focus of the laser beam L that passes through the P-lens 42 can be adjusted to be the same height as a beam cutter 24. In this case, vertical movement means movement along a direction that is perpendicular to a planar surface of the substrate S, for example, the surface of the substrate S on which the thin film is disposed.

The one or more P-lens drivers 44 may include a piezo motor or a stepping motor to move the P-lens 42.

The first monitoring member 46 monitors the line focus of the laser beam L passing through the P-lens 42.

The first monitoring member 46 may be disposed over the beam cutter 24 which is provided at opposite sides of a window 34 of the chamber 30. The first monitoring member 46 monitors a portion of the major axis of the laser beam L that is cut by the beam cutters 24.

Referring to FIG. 3, the laser beam L may be formed of a plurality of line beams L1, L2, and L3 that progress parallel to each other, and while passing through the P-lens 42, the line beams L1, L2, and L3 converge at point B.C. at a position of the beam cutter 24 to form a line focus.

The line beams L1, L2, and L3 having formed the line focus further progress and form a final focus at point B.F. of the substrate S.

An optimal final focus of the line beams L1, L2, and L3 occurs where an overlap of the line beams L1, L2, and L3 is maximized (e.g., the line beams L1, L2 and L3 are focused on substantially the same area of the substrate S). Since the optimal final focus has optimal energy density, when crystallizing an amorphous silicon thin film into a poly crystalline silicone thin film, a good efficiency may be achieved.

The final focus of the line beams L1, L2, and L3 may be the optimal focus of the line beams L1, L2, and L3. The substrate S including the thin film may be irradiated by the line beams L1, L2, and L3 having the final focus.

Referring to FIG. 4, the P-lens drivers 44 may be disposed on opposite sides of the P-lens 42, and may drive the P-lens 42 in a direction perpendicular to a planar surface of the substrate S. The planar surface of the substrate S may be the surface of the substrate S on which the thin film is formed. For example, the P-lens drivers 44 may move the P-lens 42 closer to the substrate S or farther away from the substrate S while maintaining the P-lens 42 parallel or substantially parallel to the surface of the substrate S on which the thin film is formed. The P-lens may be the last lens of the plurality of lenses and mirrors 21, 22, and 23 which the laser beam L passes through.

The one or more P-lens drivers 44 may simultaneously move the opposite sides of the P-lens 42 such that the P-lens 42 may be vertically moved while remaining parallel or substantially parallel to the surface of the substrate S on which the thin film is formed.

Further, the one or more P-lens drivers 44 may move each side of the P-lens 42 separately. For example, a first P-lens driver 44 may move a first side of the P-lens 42 that corresponds to the first P-lens driver 44 while a second P-lens driver 44 does not move a second side of the P-lens 42 that corresponds to the second P-lens driver 44. In addition, the first and second P-lens drivers 44 may move the first and second sides of the P-lens 42, respectively, by different distances in a same direction or opposite directions.

The one or more P-lens drivers 44 receive a control signal from the controller 48, and then may adjust the opposite sides of the P-lens 42 to form the optimal line focus. The adjustment of the opposite sides of the P-lens 42 may be done automatically.

Figure 5:
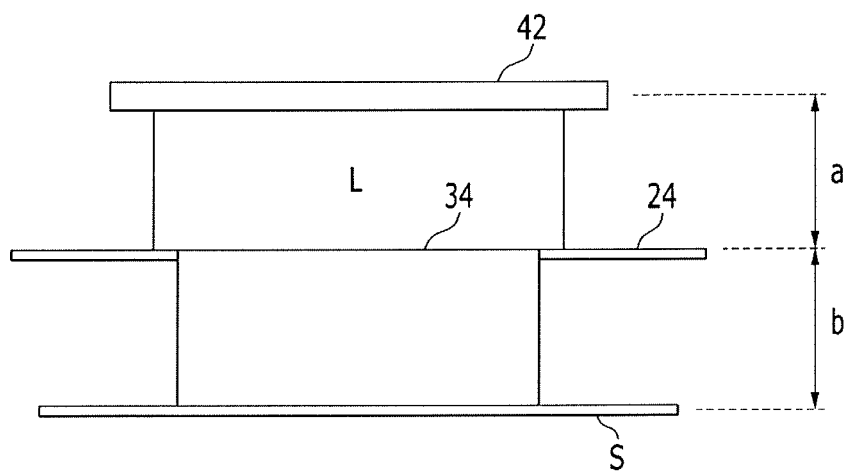
FIG. 5 illustrates a progress state of a laser beam in which a major axis appears according to an exemplary embodiment of the present invention.
Figure 6:
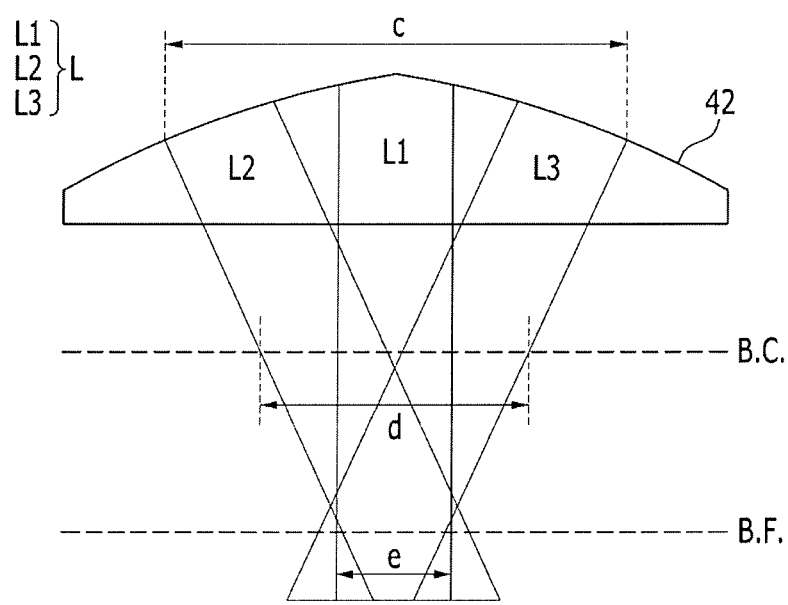
FIG. 6 illustrates a progress state of a laser beam in which a minor axis appears according to an exemplary embodiment of the present invention.

FIG. 5 illustrates a progress state of a laser beam in which a major axis appears according to an exemplary embodiment of the present invention. FIG. 6 illustrates a progress state of a laser beam in which a minor axis appears according to an exemplary embodiment of the present invention.

Referring to FIGS. 5 and 6, when the width of the minor axis of the laser beam L monitored at a point of the beam cutter 24 is identified, an optimal line focus may be determined by adjusting a distance between the P-lens 42 and the beam cutter 24 so that the width of the minor axis of the laser beam L is minimized at an irradiated point on the substrate S.

For example, if 'a' is a distance between the P-lens 42 and the beam cutter 24, 'b' is a distance between the beam cutter 24 and a point on the substrate S irradiated by the laser beam L, 'c' is a width of the minor axis of the laser beam L incident on the P-lens 42, 'd' is a width of the minor axis of the laser beam L monitored at the point B.C. of the beam cutter 24 by the first monitoring member 46, and 'e' is a width of the minor axis of the laser beam L1 at the irradiated point B.F. on the substrate S, Equations 1 and 2 below need to be satisfied.

$$(a+b):(c-e) = a:(c-d) \qquad \text{Equation 1}$$

$$e = d - \frac{b(c-d)}{a} \qquad \text{Equation 2}$$

Equations 1 and 2 are satisfied since the points of the beam cutter 24 and the substrate S are fixed, the distance 'b' between the point B.C. of the beam cutter 24 and the irradiated point B.F. on the substrate S is constant, and the width 'c' of the minor axis of the laser beam L incident on the P-lens 42 is also constant.

When the width 'd' of the minor axis of the laser beam L is measured at the point B.C. of the beam cutter 24 by the first monitoring member 46, by substituting values of 'b', 'c', and 'd' in Equation 2, 'a' may be determined so that the width 'e' may be minimized at the irradiated point B.F. on the substrate S.

In this case, the value of 'e' should be equal to or greater than zero.

For example, if 'b' is monitored at 3 mm, 'c' at 2 mm, and 'd' at 0.5 mm, and then they are substituted in Equation 2, e=0.5−(4.5/a) is satisfied. In this case, when 'a' is adjusted at 1.5 mm, 'e' becomes 0.2 mm, and when 'a' is adjusted at 1.125 mm, 'e' becomes 0.1 mm.

However, the distance between the P-lens and the beam cutter 24 should be within an operable range of the laser crystallization apparatus.

The controller 48 inputs information of the line focus of the laser beam L monitored by the first monitoring member 46, and transmits the control signal to the one or more P-lens drivers 44 to be able to operate the P-lens 42.

For example, the controller 46 provides feedback information of the line focus monitored by the first monitoring member 46 to the one or more P-lens drivers 44 to control operation of the one or more P-lens drivers 44.

Figure 7:
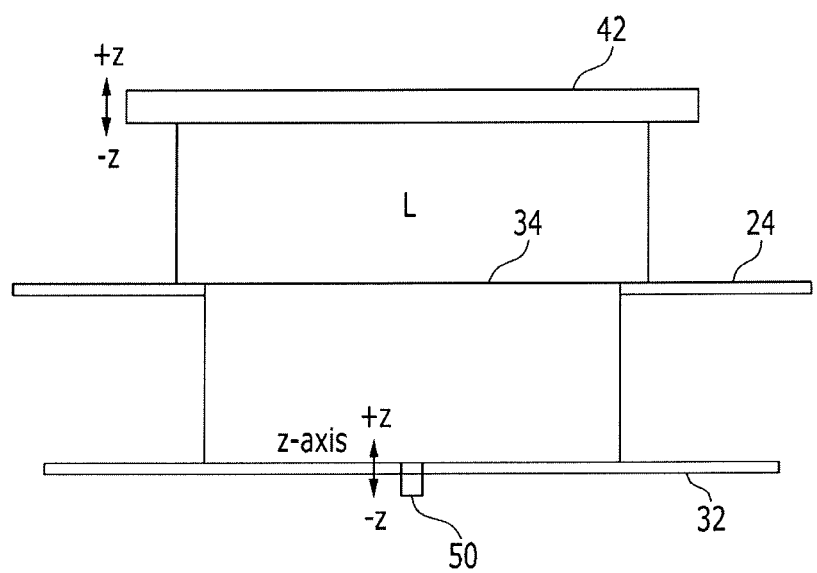
FIG. 7 is a cross-sectional view illustrating a state in which a second monitoring member is provided on a substrate stage according to an exemplary embodiment of the present invention.
Figure 8:
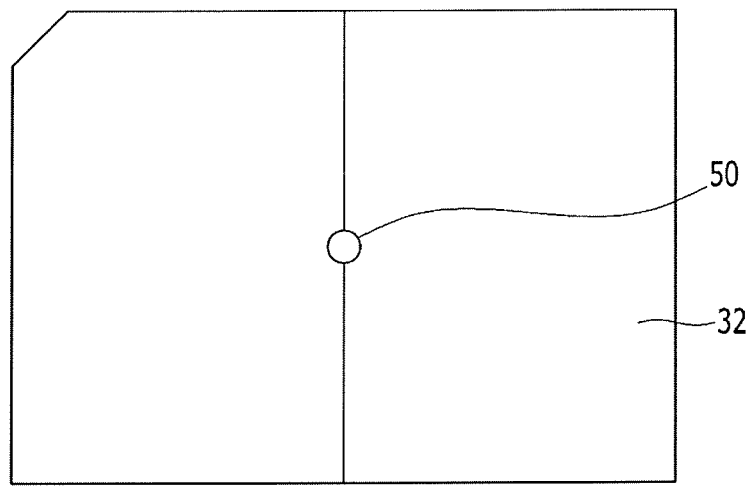
FIG. 8 is a top plan view illustrating a state in which a second monitoring member is provided on a substrate stage according to an exemplary embodiment of the present invention.

FIG. 7 is a cross-sectional view illustrating a state in which a second monitoring member is provided on a substrate stage according to an exemplary embodiment of the present invention. FIG. 8 is a top plan view illustrating a state in which a second monitoring member is provided on a substrate stage according to an exemplary embodiment of the present invention.

Referring to FIGS. 7 and 8, the laser crystallization apparatus according to an exemplary embodiment of the present invention may further include a second monitoring member 50.

The second monitoring member 50 is disposed on the substrate stage 32, and monitors the width of the minor axis of the laser beam L.

The second monitoring member 50 may be disposed in a central area of the substrate stage 32.

In addition, the second monitoring member 50 may be configured to move in a direction (z-axis) perpendicular to a planar direction of the substrate stage 32.

The second monitoring member 50 checks the width of the minor axis of the laser beam L while moving in the direction perpendicular to the planar direction of the substrate stage 32.

When the width of the minor axis of the laser beam L checked by the second monitoring member 50 is different from the width 'e' of the minor axis of the laser beam L1 at the irradiated point on the substrate S set by the line focus adjuster 40, a value of +z or −z, which is a difference of the distance 'a' between the P-lens and the beam cutter 24 set by the line focus adjuster 40, is determined. The +z or −z value is determined by calculating a difference between the width 'e' of the minor axis of the laser beam L1 at the irradiated point on the substrate S and the width of the minor axis of the laser beam L checked by the second monitoring member 50 and by substituting the difference in Equation 2.

The determined +z or −z value is used to compensate the difference between the checked minor axis of the laser beam L and the width 'e' of the minor axis of the laser beam L by automatically moving the P-lens 42 in the +z or −z direction along the z-axis by the determined +z or −z value. For example, the P-lens 42 is automatically moved in the +z or −z direction by the +z or −z value.

After the controller 48 measures the width 'e' of the minor axis of the laser beam L at the irradiated point on the substrate S in the second monitoring member, it determines whether the determined value of +z or -z is within the operation range of the z-axis direction of the P-lens. When it is within the operation range, the operation of the P-lens is completed, and when it is out of the operation range, the value of +z or −z is determined again at the second monitoring member.

Figure 9:
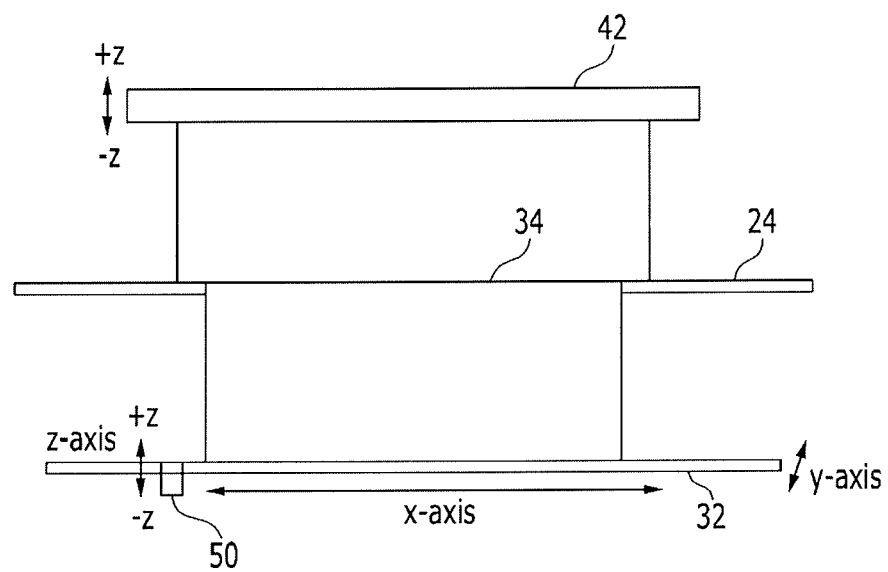
FIG. 9 is a cross-sectional view illustrating a state in which a second monitoring member is provided on a substrate stage according to an exemplary embodiment of the present invention.
Figure 10:
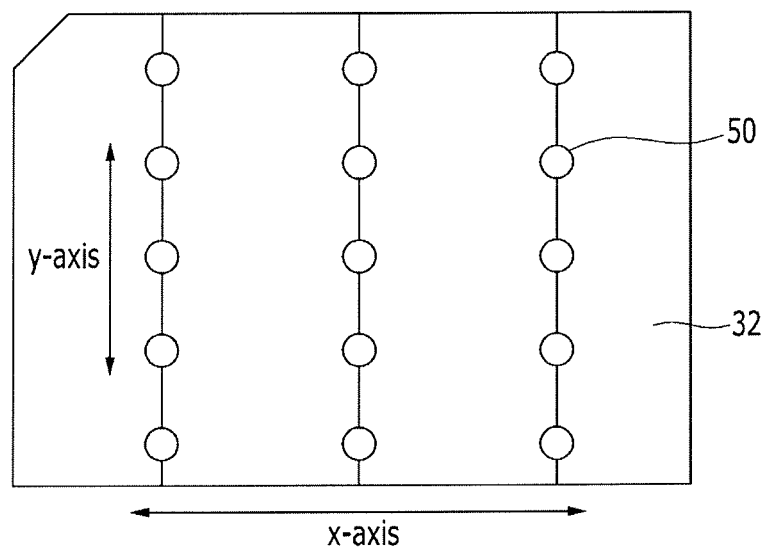
FIG. 10 is a top plan view illustrating a state in which a second monitoring member is provided on a substrate stage according to an exemplary embodiment of the present invention.

FIG. 9 is a cross-sectional view illustrating a state in which a second monitoring member is provided on a substrate stage according to an exemplary embodiment of the present invention. FIG. 10 is a top plan view illustrating a state in which a second monitoring member is provided on a substrate stage according to an exemplary embodiment of the present invention.

Referring to FIGS. 9 and 10, the second monitoring member 50 may be formed to move in a direction parallel to the direction (y-axis) of the minor axis of the laser beam L.

Alternatively, the second monitoring member 50 may be formed to move in a direction parallel to the direction (x-axis) of the major axis of the laser beam L.

The second monitoring member 50 may check the width of the minor axis of the laser beam L at the point on the substrate S irradiated by the laser beam L while moving in the direction parallel to the direction (y-axis) of the minor axis of the laser beam L.

The value of +z or −z is determined by calculating a difference between an average value of the width of the minor axis of the laser beam L at the point on the substrate S irradiated by the laser beam L and the width 'e' of the minor axis of the laser beam L at the irradiated point on the substrate S set by the line focus adjuster 40. The average value of the width of the minor axis of the laser beam L is determined using the second monitoring member 50. The determined +z or −z value is used to compensate the difference between the average value of the width of the minor axis of the laser beam L and the width 'e' of the minor axis of the laser beam L by automatically moving the P-lens 42 in the +z or −z direction along the z-axis by the determined +z or −z value. For example, the P-lens 42 is automatically moved in the +z or −z direction by the +z or −z value.

The second monitoring member 50 may check and automatically compensate a distortion of the substrate stage 32 while moving in the direction parallel to the major axis of the laser beam L.

As shown in FIG. 10, a plurality of the second monitoring members 50 may be formed on a surface of the substrate stage 32. Each of the second monitoring members 50 measures the size of the laser beam L while moving in the major axis direction (x-axis) of the laser beam, in the minor axis direction (y-axis) of the laser beam, and in the direction (z-axis) perpendicular to the planar direction of the substrate stage 32. Then, the second monitoring member 50 may transmit the measured results to the one or more P-lens drivers 44 through the controller 48 to automatically control a position of the P-lens 42 in real-time.

According to an exemplary embodiment of the present invention, even as a laser-crystallizing process of a substrate proceeds, since a line focus of a laser beam is automatically adjusted in real-time, equipment is not required to stop during measurement, thereby increasing the utilization rate of the equipment.

In addition, according to an exemplary embodiment of the present invention, since an optimal line focus of a laser beam is corrected in real-time when the laser beam is irradiated, uniformity of the laser beam increases. Thus, an inferiority rate of the laser decreases.

While the present invention has been particularly shown and described with reference to exemplary embodiments thereof, it will be apparent to those of ordinary skill in the art that various changes in form and detail may be made therein without departing from the spirit and scope of the inventive concept.

What is claimed is:

1. A laser crystallization apparatus, comprising:
   a laser generator that generates a laser beam including a plurality of line beams that are parallel to each other;
   an optical system that includes a plurality of lenses and mirrors, wherein the optical system optically converts the generated laser beam to a converted laser beam;
   a chamber that includes a stage and a substrate disposed on the stage, wherein a laser-crystallized thin film is formed on the substrate when the substrate is irradiated by the converted laser beam;
   a beam cutter that is provided at opposite sides of a window of the chamber; and
   a line focus adjuster that adjusts a line focus and a final focus of the plurality of line beams passing through the optical system, wherein the substrate is irradiated by the plurality of line beams at the final focus of the plurality of line beams,
   wherein the line focus is formed at a same height as the beam cutter, and the final focus is formed at a same height as the substrate,
   wherein the line focus adjuster includes:
      a P-lens that is closest to the chamber from among the plurality of lenses and mirrors of the optical system; and
      one or more P-lens drivers that move a position of the P-lens, and
   wherein the beam cutter is disposed between the substrate and the P-lens such that the converted laser beam, after having passed through the P-lens, passes through the beam cutter before the substrate is irradiated by the converted laser beam.

2. The laser crystallization apparatus of claim 1, wherein the line focus adjuster includes:
   a first monitoring chamber that monitors the line focus of the plurality of line beams passing through the P-lens; and
   a controller that inputs information of the monitored plurality of line beams and transmits a control signal to the one or more P-lens drivers so that the P-lens is driven.

3. The laser crystallization apparatus of claim 2, wherein the P-lens driver includes a piezo motor or a stepping motor.

4. The laser crystallization apparatus of claim 2, wherein the one or more P-lens drivers are disposed at opposite sides of the P-lens to operate the P-lens in a direction perpendicular to a planar surface of the substrate.

5. The laser crystallization apparatus of claim 4, wherein the one or more P-lens drivers simultaneously move the opposite sides of the P-lens.

6. The laser crystallization apparatus of claim 4, wherein the one or more P-lens drivers separately move each of the opposite sides of the P-lens.

7. The laser crystallization apparatus of claim 2, wherein a first monitoring member is disposed on the beam cutter.

8. The laser crystallization apparatus of claim 7, wherein the first monitoring member monitors a portion of a major axis of the laser beam cut by the beam cutter.

9. The laser crystallization apparatus of claim 2, further comprising a second monitoring member disposed on the stage, wherein the second monitoring member monitors a width of a minor axis of the laser beam.

10. The laser crystallization apparatus of claim 9, wherein the second monitoring member is configured to move in a direction perpendicular to a planar direction of the stage.

11. The laser crystallization apparatus of claim 9, wherein the second monitoring member is disposed in a central area of the stage.

12. The laser crystallization apparatus of claim 9, wherein the second monitoring member is configured to move in a direction parallel to the minor axis of the laser beam.

13. The laser crystallization apparatus of claim 9, Wherein the second monitoring member is configured to move in a direction parallel to the major axis of the laser beam.

14. The laser crystallization apparatus of claim 9, wherein a plurality of the second monitoring members are formed on a surface of the stage.

15. A laser crystallization apparatus, comprising:
   a laser beam generator that generates a plurality of parallel line beams;
   an optical system including a mirror and a plurality of lenses, wherein the plurality of parallel line beams enter the optical system, are reflected by the mirror, and pass through the plurality of lenses,
   wherein a last lens, from among the plurality of lenses which the plurality of parallel line beams pass through, is a P-lens,
   wherein the P-lens condenses the plurality of parallel line beams to a first focus point;
   wherein the condensed plurality of parallel line beams passes through a beam cutter comprising a first monitoring member disposed thereon after having passed through the P-lens;
   a first chamber including a stage and a substrate disposed on the stage; and
   a second chamber in which the beam cutter and the first monitoring member are disposed, wherein the first monitoring member is configured to detect a width of the condensed plurality of parallel line beams at the first focus point,
   wherein the first focus point is disposed between the substrate and the P lens, and, a second focus point is disposed at a point where the thin film is irradiated, and
   wherein a thin film disposed on the substrate is irradiated by the condensed plurality of parallel line beams.

16. The laser crystallization apparatus of claim 15, wherein a width of the condensed plurality of parallel line beams at the first focus point is larger than a width of the condensed plurality of parallel line beams at the point where the thin film is irradiated.

17. The laser crystallization apparatus of claim 16, wherein the plurality of parallel line beams, having passed through the P-lens, are focused on substantially a same area of the substrate.

18. The laser crystallization apparatus of claim 16, further comprising:
   a P-lens driver configured to move the P-lens in a direction substantially perpendicularly to a surface of the substrate on which the thin film is disposed based on a control signal; and a controller configured to transmit the control signal to the P-lens driver based on the detected width of the condensed plurality of parallel line beams at the first focus point.

19. The laser crystallization apparatus of claim 16, further comprising a second monitoring member disposed on the stage, wherein the second monitoring member monitors a width of a minor axis of the plurality of parallel line beams;
- a P-lens driver configured to move the P-lens in a direction substantially perpendicularly to a surface of the substrate on which the thin film is disposed based on a control signal; and
- a controller configured to transmit the control signal to the P-lens driver based on the monitored width of the minor axis of the plurality of parallel line beams.

20. The laser crystallization apparatus of claim 19, wherein the second monitoring member is configured to move along a plane that is parallel to the surface of the substrate on which the thin film is disposed.

* * * * *